United States Patent [19]
Doran

[11] Patent Number: 6,039,057
[45] Date of Patent: Mar. 21, 2000

[54] AUTOMATED WASHING SYSTEM AND METHOD

[75] Inventor: Daniel B. Doran, Fort Collins, Colo.

[73] Assignee: Hyundai Electronics America, San Jose, Calif.

[21] Appl. No.: 09/388,333

[22] Filed: Sep. 2, 1999

Related U.S. Application Data

[62] Division of application No. 08/026,669, Mar. 5, 1993.

[51] Int. Cl.$^7$ ...................................................... B08B 3/10
[52] U.S. Cl. .................... 134/95.2; 134/95.3; 134/102.3; 134/902; 134/104.1
[58] Field of Search .................................. 134/95.1, 95.2, 134/95.3, 102.1, 102.3, 61, 902, 1.3, 104.1; 422/24

[56] References Cited

U.S. PATENT DOCUMENTS

| | | |
|---|---|---|
| 4,760,014 | 7/1988 | Wong . |
| 5,151,135 | 9/1992 | Magee et al. . |
| 5,301,700 | 4/1994 | Kamikawa et al. . |
| 5,715,851 | 2/1998 | Jung et al. . |
| 5,749,975 | 5/1998 | Li et al. . |

*Primary Examiner*—Frankie L. Stinson
*Attorney, Agent, or Firm*—Townsend and Townsend and Crew LLP

[57] ABSTRACT

A system and a method for washing objects, such as cassettes and carriers used to hold and transport silicon wafers during manufacture of semiconductor chips. The method employs the steps of exposing to ultraviolet radiation the objects in a process chamber, spraying of developer fluid onto the objects, rinsing the objects, spraying of surfactant solution on the objects, rinsing the objects and drying the objects using heated, ionized ULPA filtered air. Apparatus for accomplishing the above is disclosed.

16 Claims, 3 Drawing Sheets

AUTOMATED WASHING SYSTEM AND METHOD

This is a division of application Ser. No. 08/026,669, filed Mar. 5, 1993, still pending.

BACKGROUND OF THE INVENTION

The present invention relates generally to an automated washing system and method, and more specifically relates to such a system and method for washing semiconductor wafer cassettes and carriers.

Cassettes and carriers which are used to hold and transport silicon wafers for photolithographic processing become contaminated with resist flakes. Failure to clean these resist flakes from the cassettes and carriers results in these flakes being transferred to the wafers during subsequent processing operations. These transferred resist flakes are a major source of photolithographic defects, referred to as defects without inclusion.

Current systems available commercially are of two basic design types: hot deionized water and surfactant spray systems which are effective for normal particle removal, but which are not capable of removing resist flakes from cassettes; and solvent-based systems which are effective for both particle removal and resist removal. The first system mentioned above has the drawback of only removing particles. Removing resist flakes from contaminated parts is done by immersion and/or manual scrubbing with a resist removing solvent. The second system mentioned above has the disadvantage of the requirement for special handling and disposal of the resist removal solvents.

SUMMARY OF THE INVENTION

The system and method of the present invention specifically address the hazards and disposal issues associated with solvent use, and provide a system which is capable of cleaning particulates that normally accumulate on the cassettes and carriers from processing equipment, and which is further capable of removing resist flakes without the use of solvents.

The system incorporates hardware for chemical spray delivery, hot ultra-pure water spray rinsing and hot ULPA (ultra-low particulate air) filtered air drying with an ionization air system for static elimination. Also provided are an ultraviolet light source to insure complete exposure of any resist contamination, and spray delivery of high normality universal resist developer. These features provide for complete and rapid removal of resist contamination using a chemical that does not require special waste handling. The system can be effective for cleaning any resist contaminated part used in wafer fabrication.

It is accordingly an object of the present invention to provide an automated washing system.

It is another object of the present invention to provide a system for automated washing of semiconductor wafer cassettes and carriers.

Another object of the present invention is to provide a process for automated washing.

Another object of the present invention is to provide a process for automated washing of semiconductor wafer cassettes and carriers.

Additional benefits and advantages of the present invention will become apparent to those skilled in the art to which this invention relates from the subsequent description of the preferred embodiment and the appended claims, taken in conjunction with the accompanying drawings.

DETAILED DESCRIPTION

Figure 1:
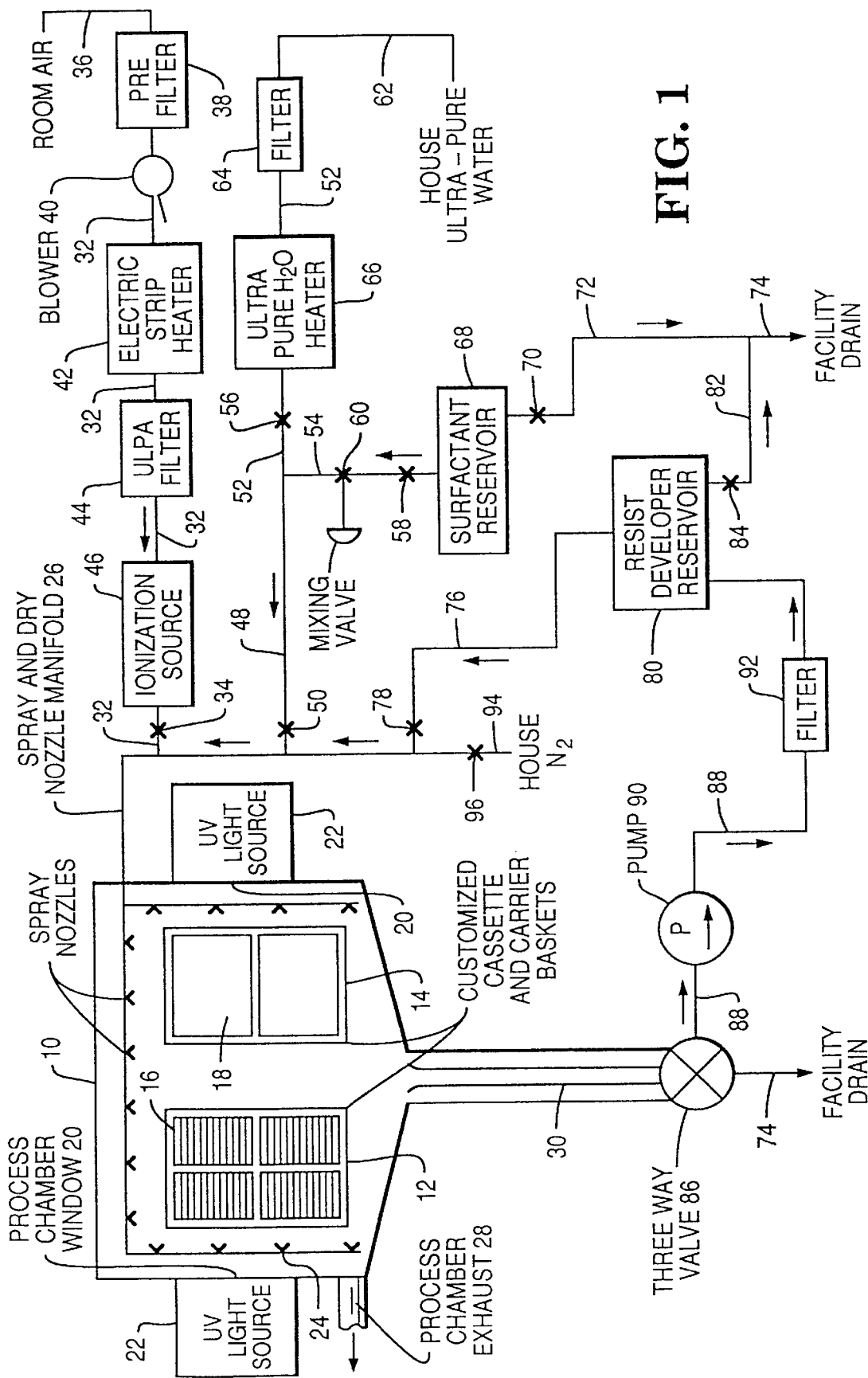
FIG. 1 is a diagram of the automated cassette and carrier washing system.

Referring now to FIG. 1, shown there is a schematic diagram of a system for washing objects such as cassettes and carriers for semiconductor wafers. In the manufacture of semiconductor chips, wafers from which the chips are made are often fixed in a cassette for undergoing various processing steps. In turn, a plurality of cassettes may be retained in a carrier for processing and movement from station to station. Because of the well-known requirement for a very high degree of cleanliness during semiconductor chip manufacture, the cassettes and carriers must be cleaned before each re-use. The present system provides a means for such cleaning.

Cleaning of the cassettes and carriers takes place in a process chamber 10, in which baskets 12 and 14 for holding cassettes 16 and carriers 18 may be placed. The process chamber includes windows 20 through which ultraviolet radiation from ultraviolet light sources 22 may be applied to the interior of the chamber 10. Arranged at least partially around the perimeter of the interior of the process chamber 10 are a plurality of spray nozzles 24. These spray nozzles are connected to a spray and dry nozzle manifold 26. A number of lines for carrying various gaseous and liquid fluids are connected to the manifold 26. A chamber exhaust 28 is provided for exhausting contaminated air from the chamber 10, and a liquid exhaust line 30 is provided for removing contaminated liquids from the chamber 10.

A first line 32 connected to the manifold 26 contains a valve for controlling fluid movement therethrough, and is utilized to provide for the admission of heated, ionized ultra-low particulate air into the chamber. Room air is drawn into and through the line 32 at an input 36, undergoes a preliminary filtering to remove large particles by movement through a pre-filter 38, is drawn into and through the line 32 by a blower 40, is heated by an electric strip heater 42, is filtered by an ultra-low particulate air filter 44, and is ionized by an ionization source 46 before passing through the valve 34 and the manifold 26 to be delivered into the chamber 10 and through the nozzles 24 under pressure from the blower 40.

It will be understood that the air is heated to improve its drying capability, is filtered to minimize the likelihood of introducing foreign particles into the chamber 10, and is ionized to minimize any charge picked up by the air by virtue of its movement. This in turn minimizes the likelihood of the cleaned parts having electrostatic charges which may attract particles out of the air.

A second line 48 connected to the manifold 26 is provided with a first control valve 50. The line 48 is connected to two branch lines 52 and 54, each of which is provided with a control valve 56 and 58, respectively. In addition, the line 54 is also provided with a mixing valve 60 to enable control of the relative proportions of fluids entering the line 48 from the two lines 52 and 54. Ultra-pure water from a central source 62 within the manufacturing facility, that is, "house" water, is filtered by a filter 64 and heated by a heater 66 before passing through the valve 56 in the line 52 to enter the line 48. A suitable surfactant is contained in a surfactant reservoir and is applied to the line 54 through the valve 58. The proportion of surfactant to ultra-pure water which is introduced into the line 48 is controlled by the mixing valve 60. The surfactant is in effect a soap which is used to break the surface tension between particles and the surfaces to which they are adhered. Any suitable non-ionic surfactant may be used. One such surfactant is marketed under the name of "TRITON X-100". The surfactant reservoir 68 is connected by a line 72 through a valve 70 to a facility drain 74. The valve 72 is normally closed and is opened only when it is desired to drain the reservoir 68 for purposes of maintenance or refilling.

A third line 76 connected to the manifold 26 is provided with a control valve 78. The line 76 is connected to a resist developer reservoir 80, from which resist developer is supplied to the manifold 26, and from there through the spray nozzles 24 to the interior of the process chamber 10. Any suitable "universal high normality" resist developer may be used. The term "universal" is used to indicate that the resist developer will work with a variety of photo-resists, and the term "high normality" is used to refer to a resist developer having a high rate of removal, that is, being relatively strong. The resist developer reservoir 80 is connected by a line 82 through a valve 84 to the facility drain 74. The valve 84 is normally closed and is opened only when it is desired to drain the reservoir 80 for purposes of maintenance or refilling.

The liquid exhaust line 30 from the process chamber 10 is connected through a three-way valve 86 to the facility drain 74 and to a line 88 which extends through a pump 90 and a filter 92 to the resist developer reservoir 80. By use of this arrangement, it is possible either to drain the used liquid from the chamber 10 to the facility drain 74 or to recycle said liquid by pumping it through the filter 92 to remove contaminants and returning it to the resist developer reservoir 80 for further use.

Nitrogen from a central source may be applied through a valve 96 to the manifold 26. The "house" nitrogen is supplied through the valve 96 only at certain times, and is used with the drying operation after the application of liquids to the chamber 10 to purge the manifold 26 and the spray nozzles 24.

Figure 3:
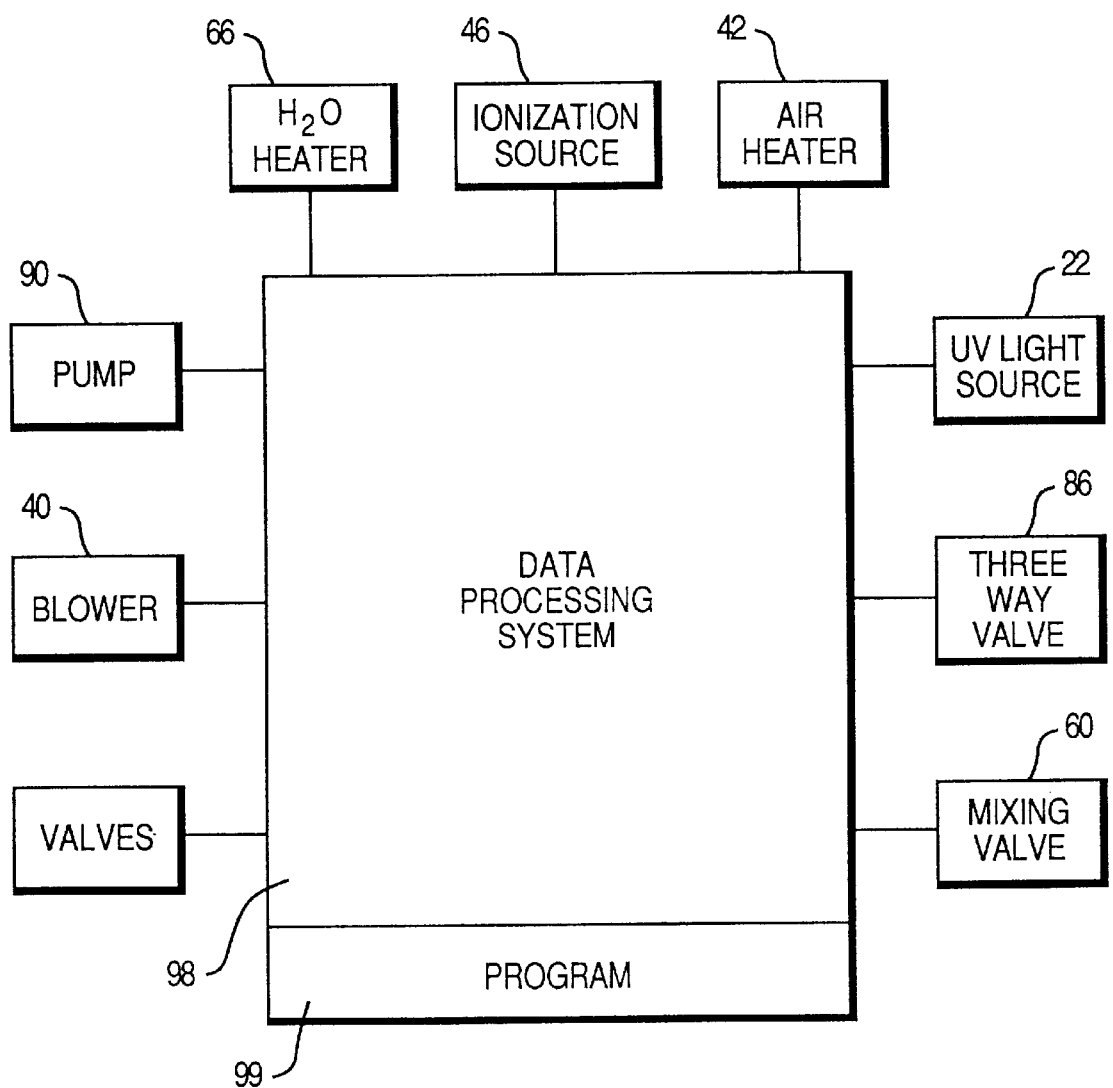
FIG. 3 is a block diagram showing a control system for the automated washing system.

The UV light source 22, the blower 40, the strip heater 42, the ionization source 46, the water heater 66, the pump 90 and the various valves, including the mixing valve 60 and the three way valve 86, are all controlled by a suitable control system, in order to assure a proper sequence of events and operation within predetermined parameters of the heaters, ionization source, blower and pump. Such a control system may comprise a data processing system 98, operated by a suitable program 99, and connected to the various elements which it controls, as shown diagrammatically in FIG. 3.

Figure 2:
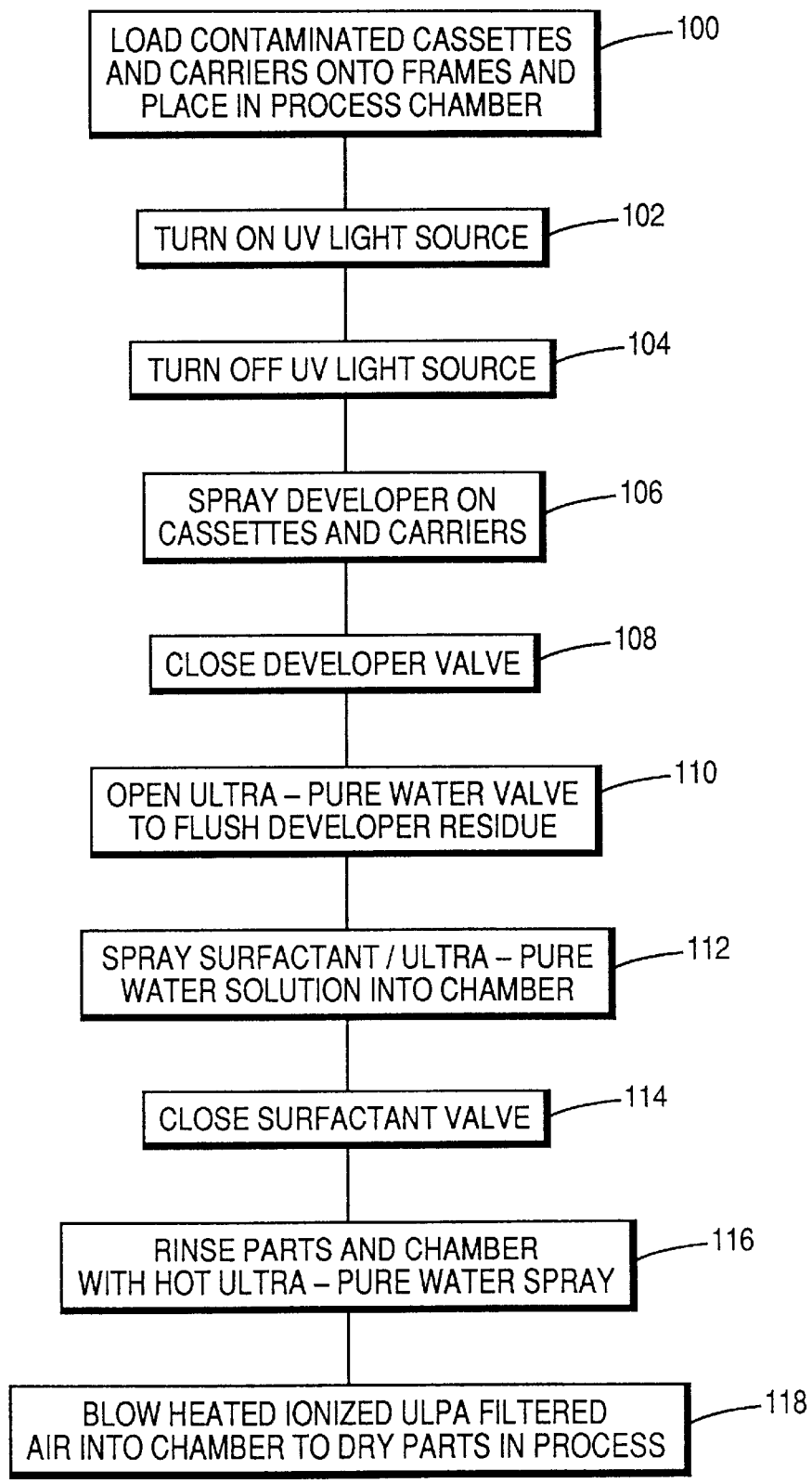
FIG. 2 is a flow diagram showing a process for washing cassettes and carriers using the system of FIG. 1.

Shown in FIG. 2 is a flow diagram which illustrates generally the washing process which is employed using the system of FIG. 1. The process is initiated, as represented in block 100, by loading contaminated cassettes and carriers onto custom-made frames or baskets designed to hold them in a fixed position for processing and placing them in the process chamber 10. The UV light source is then turned on (block 102) to insure complete exposure of any resist flakes, after which it is turned off (block 104). Universal resist developer is then pumped from the reservoir 80 through the manifold 26 and the spray nozzles 24, as represented in block 106. The spray nozzles 24 create a heavy spray/fog of developer which thoroughly bathes the cassettes 16 and the carriers 18, dissolving any resist contamination. The developer solution is routed through the three-way drain valve 86 and pumped by pump 90 through filter 92 prior to returning to the reservoir 80. Upon completion of the develop cycle, the developer valve 78 to the manifold 26 is closed (block 108) and the pump 90 is turned off. Next, the ultra-pure water valve is opened (block 110) to flush developer residue and the three-way valve 86 moves to the facility drain position. After a brief ultra-pure water rinse to flush developer residue, the surfactant mixing valve 60 is opened and the resulting surfactant/ultra-pure water solution is sprayed into the chamber 10 to wash away any particulates, as represented in block 112. The surfactant valve is then closed (block 114) and the hot ultra-pure water spray is used to rinse the parts in process and the process chamber 10 (block 116). Upon completion of the rinse cycle, heated ionized ULPA filtered air is blown into the process chamber 10 to dry the parts in process, as represented in block 118. This concludes the process.

The following additional comments may be made with respect to the process described above. The ultraviolet light source 22 can be tailored to match the sensitivity of the photoresist being used. The developer used should be universal for the type of photoresist used in the manufacturing process. Application of the developer could also be accomplished by an immersion system. Its effectiveness could be enhanced by the addition of ultrasonic energy.

While the form of the invention shown and described herein is admirably adapted to fulfill the objects primarily stated, it is to be understood that it is not intended to confine the invention to the form or embodiment disclosed herein, for it is susceptible of embodiment in various forms within the scope of the appended claims.

What is claimed is:

1. A system for automated washing of objects, comprising:
    a chamber for holding the objects to be washed;
    means for applying ultraviolet radiation to the objects in the chamber;
    means for applying developer fluid to the objects in the chamber;
    means for applying a surfactant solution to the objects in the chamber;
    means for rinsing the objects in the chamber after application of the developer fluid and after application of the surfactant solution; and
    means for blowing air into the chamber to dry the objects after washing.

2. The system of claim 1, in which the means for applying developer fluid, the means for applying surfactant solution, the means for rinsing and the means for blowing air all comprise a plurality of spray nozzles in the chamber.

3. The system of claim 2, in which the means for applying developer fluid and the means for applying surfactant solution comprise a developer reservoir and a surfactant reservoir, both controlled by valves and connected by piping to the plurality of spray nozzles.

4. The system of claim 3, in which the means for applying surfactant solution also comprises means for supplying ultra-pure filtered, heated water and a mixing valve for controlling the relative proportions of surfactant from the surfactant reservoir and water.

5. The system of claim 3, also comprising means for draining the surfactant and developer reservoirs.

6. The system of claim 3, also including a serially coupled valve, pump and filter connecting the chamber and the developer reservoir for recycling the developer fluid.

7. The system of claim 1, in which the means for blowing air comprises a serially connected pre-filter, a blower, a heater, a ULPA filter and an ionization source.

8. The system of claim 1, in which said objects comprise cassettes for holding silicon wafers and carriers for holding cassettes.

9. The system of claim 1, also including means for applying nitrogen gas to the chamber.

10. A system for automated washing of objects used to hold and transport silicon wafers for photolithographic processing, comprising:

a process chamber for holding objects to be washed;

at least one ultraviolet light source for applying ultraviolet radiation to objects within the chamber;

a plurality of spray nozzles positioned within the chamber to spray fluids upon the objects to be washed;

a spray and dry nozzle manifold connected to the plurality of spray nozzles;

a resist developer reservoir;

a first pipe line including a valve connecting the resist developer reservoir to said manifold;

a surfactant reservoir;

a source of ultra-pure water;

a second pipe line including a plurality of on-off valves and a mixing valve connected to said surfactant reservoir, to said said source of ultra-pure water and to said manifold for delivering water from said water source and delivering surfactant from said surfactant reservoir to said manifold;

an air supply for supplying ultra-pure air to said process chamber;

a third pipe line including a valve connecting the air supply to said manifold; and control means for controlling the sequence in which ultraviolet radiation, resist developer fluid, surfactant, water and air are applied to the objects in the process chamber for washing and drying said objects.

11. The system of claim 10, also including a source of nitrogen gas and a pipe line including a valve connecting said source of nitrogen/gas to said manifold.

12. The system of claim 10, in which the air supply for supplying ultra-pure air to said process chamber comprises a serially connected blower, heater, ULPA filter and an ionization source.

13. The system of claim 10, also including a serially coupled valve, pump and filter connecting the chamber and the resist developer reservoir for recycling the resist developer fluid.

14. The system of claim 10, also including means for draining the surfactant and resist developer reservoirs.

15. The system of claim 14, in which the source of ultra-pure water comprises a serially connected filter and heater.

16. The system of claim 10, in which said mixing valve in said second pipe line can be adjusted to supply a desired mixture of surfactant and water to said manifold.

\* \* \* \* \*